Figure 1:
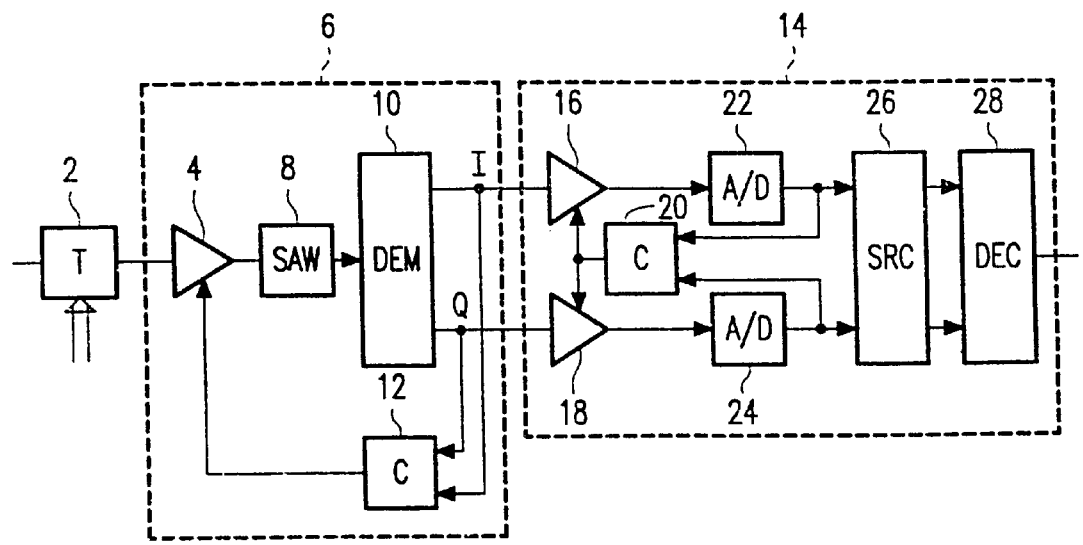

US006163685A

United States Patent [19]
Dilling et al.

[11] Patent Number: 6,163,685
[45] Date of Patent: Dec. 19, 2000

[54] RECEIVER WITH CONTROLLABLE AMPLIFIER MEANS

[75] Inventors: Edwin R. Dilling; Peter J. H. Rutten; Marcus G. J. J. Klaassen; Robbert H. Van Der Wal, all of Eindhoven, Netherlands

[73] Assignee: U.S. Philips Corporation, New York, N.Y.

[21] Appl. No.: 09/080,837

[22] Filed: May 18, 1998

[30] Foreign Application Priority Data

May 23, 1997 [EP] European Pat. Off. ............. 97201555

[51] Int. Cl.[7] ...................................................... H04B 1/10
[52] U.S. Cl. .................... 455/247.1; 375/345; 455/253.2
[58] Field of Search .................................... 455/309, 347, 455/341, 355, 130, 136, 138, 232, 232.1, 247.1, 250.1, 251.1, 253.2, 254, 289, 311; 375/316, 318, 324, 340, 339, 345; 330/96, 85, 129; 329/308

[56] References Cited

U.S. PATENT DOCUMENTS

| | | | |
|---|---|---|---|
| 4,574,246 | 3/1986 | Yoshida | 329/124 |
| 5,349,548 | 9/1994 | Nillesen | 364/724.1 |
| 5,550,869 | 8/1996 | Gurantz et al. | 375/340 |
| 5,617,060 | 4/1997 | Wilson et al. | 330/129 |
| 5,722,062 | 2/1998 | Nakanishi et al. | 455/247.1 |
| 5,729,173 | 3/1998 | Sato | 329/308 |
| 5,774,450 | 6/1998 | Harada et al. | 370/206 |

OTHER PUBLICATIONS

"Interpolation in Digital Modems—Part 1: Fundamentals", by F.M. Gardner in IEEE transactions on Communications, vol. 41, No. 3, Mar. 1993, pp. 501–507.

"Interpolation in Digital Modems—Part 2: Implementation and Performance", by L. Erup, F.M. Gardner and R.A. Harris in IEEE transactions on Communications, vol. 41, No. 6, Jun. 1993, pp. 998–1008.

*Primary Examiner*—Edward F. Urban
*Assistant Examiner*—Conguan Tran
*Attorney, Agent, or Firm*—Daniel J. Piotrowski

[57] ABSTRACT

In a receiver for digital symbols, an input signal received by a tuner is passed via a SAW filter and a controllable amplifier to an input of a demodulator. The output signals (I,Q) of the demodulator are passed via controllable amplifiers to analog to digital converters. In order to avoid the use of a feedback signal from the digital part of the receiver to the analog part it is proposed to use first control means for controlling the output signal of the demodulator and second control means for controlling the output signal of the analog to digital converters. An additional advantage is that both control means can be optimized for their respective environments.

5 Claims, 3 Drawing Sheets

RECEIVER WITH CONTROLLABLE AMPLIFIER MEANS

The present invention is related to a receiver comprising an input being coupled to an input of first controllable amplifier means, an output of the first controllable amplifier means being coupled to an input of a demodulator, an output of the demodulator being coupled to an input of second controllable amplifier means, an output of the second controllable amplifier means being connected to an input of an analog to digital converter A receiver according to the preamble is known from U.S. Pat. No. 4,574,246.

Such receivers can be used for receiving (digital) broadcast signals e.g. DAB and DVB signals. In such a receiver the RF signal at the input is converted into an intermediate signal with a frequency substantially lower than the frequency of the RF signal. This intermediate frequency signal is amplified by the first controllable amplifier means and subsequently demodulated by the demodulator, The output signal of the demodulator is amplified by the second amplifier means and subsequently converted into a digital signal by the analog to digital conversion means.

Because the strength of the input signal of the receiver can vary considerably, the first amplifier means are controllable to obtain a substantially constant signal at the output signal at the output of the analog to digital converter means. The receiver according to the above mentioned US Patent, comprises a detector deriving from the output signal of the analog to digital conversion means a control signal which is applied to a control input of the first controllable amplifier means. In this way a signal having a constant peak value is obtained at the output of the analog to digital converting means, enabling the optimum exploitation of the (limited) dynamic range of said analog to digital conversion means.

A problem with this control signal is that it is originated in the digital part of the receiver, which can give rise to interfering signals being present on the signal applied to the first controllable amplifier means. Because the signals at the input of the first controllable amplifier means are very weak, they can easily be adversely affected by said interfering signals coming from the digital part of the receiver.

An object of the present invention is to provide a receiver according to the preamble in which the possibility of interference due to the signals in the digital part of the receiver is substantially reduced.

To achieve the object of the present invention the receiver is characterized in that the receiver comprises first control means for controlling the gain of the first controllable amplifier means in response to a signal representative for a signal at the output of the demodulator, and in that the receiver comprises second control means for controlling the gain of the path from the output of the demodulator to the input of the analog to digital converter means in response to a signal representative for a signal at the output of the analog to digital converter means.

By introducing first control means which control the gain of the first amplifier means in response to a signal representative of the signal at the output of the demodulator, it is obtained that no control signal has to be passed from the digital part of the receiver to the input part of the receiver. By introducing second control means which are controlled in response to a signal at the output of the analog to digital conversion means, it is still obtained that at the output of the analog to digital conversion means a substantially constant signal is present.

An additional advantage of the receiver according to the present invention is that the first control means can be designed to obtain an optimal performance of the demodulator, and the second control means can be designed to optimize the performance of the analog to digital converter means.

It is observed that the receiver according to the above mentioned US patent comprises a controllable amplifier between the output of the demodulator and the input of the analog to digital conversion means. However, this amplifier is present to equalize the gain of the quadrature paths between the output of the demodulator and the input of the analog to digital conversion means. It is not used to control the level of the output signal of the analog to digital converter means.

An embodiment of the invention is characterized in that the first control means are arranged to control the first controllable amplifier means for obtaining a signal representing the signal at the output of the demodulator having a substantially constant power, and in that the second control means are arranged to control the second amplifier means for obtaining a signal representative for the signal at the output of the analog to digital converter means a signal having a substantially constant amplitude.

The output signal of the demodulator is to be controlled in order to limit the distortion in the demodulator. The best way to do this, is to control the output power of said demodulator, because the properties of the output signal of the demodulator depend heavily on the symbol rate of the digital signal carried by it. Said symbol rate can vary from 1 Mbaud/s to 45 Mbaud/s.

The output signal of the analog to digital converter is to be controlled in order to avoid clipping or overflows of the output signal of the analog to digital converter means. This is obtained by controlling the second controllable amplifier in response to the amplitude of the signal representing the output signal of the analog to digital conversion means.

A further embodiment of the receiver according to the invention is characterized in that the receiver comprises conversion means for converting the output signal of the analog to digital conversion means into an output signal having a sampling rate corresponding to a symbol rate of digital symbols carried by the output signal of the analog to digital conversion means, and in that the receiver comprises third control means for obtaining an output signal having a substantially constant amplitude.

In receivers for digital signals it is convenient to process the digital signal with a second sample rate which is a multiple of the symbol rate of the received signal. This processing can comprise filtering with a so-called half Nyquist filter, and decoding the output signal of the converting means. In order to be able to do so, the signal with the first sample rate has to be converted to a signal with a second sample rate. In order to prevent so-called aliasing, the first filter is arranged for filtering the first signal in such a way that the sampling theorem for the second signal is still met. Due to said conversion and filtering the amplitude of the signal may change, dependent on the actual symbol rate.

By introducing third control means for obtaining an output signal having a substantial constant amplitude, an output signal with precisely defined signal levels is available. Such an output signal can readily be decoded by a error control decoder, such as a Viterbi decoder.

A further embodiment of the invention is characterized in that the receiver comprises a first module comprising the first controllable amplifier means, the first control means and the demodulator, and a second module comprising the second controllable amplifier means and the analog to digital converter means, and in that the second module does not comprise any outputs coupled to inputs of the first module.

By placing the parts of the receiver carrying small analog signals in a first module, placing the digital part in a second module, and avoiding any outputs of the digital part to be coupled to inputs of the parts of the receiver carrying small analog signals, it is prevented that interfering signals from the digital part adversely affect said small analog signals.

Figure 2:
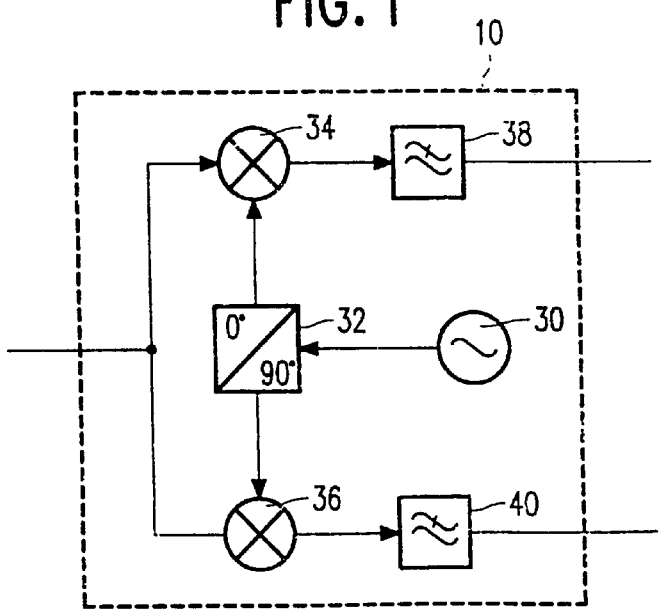
Figure 3:
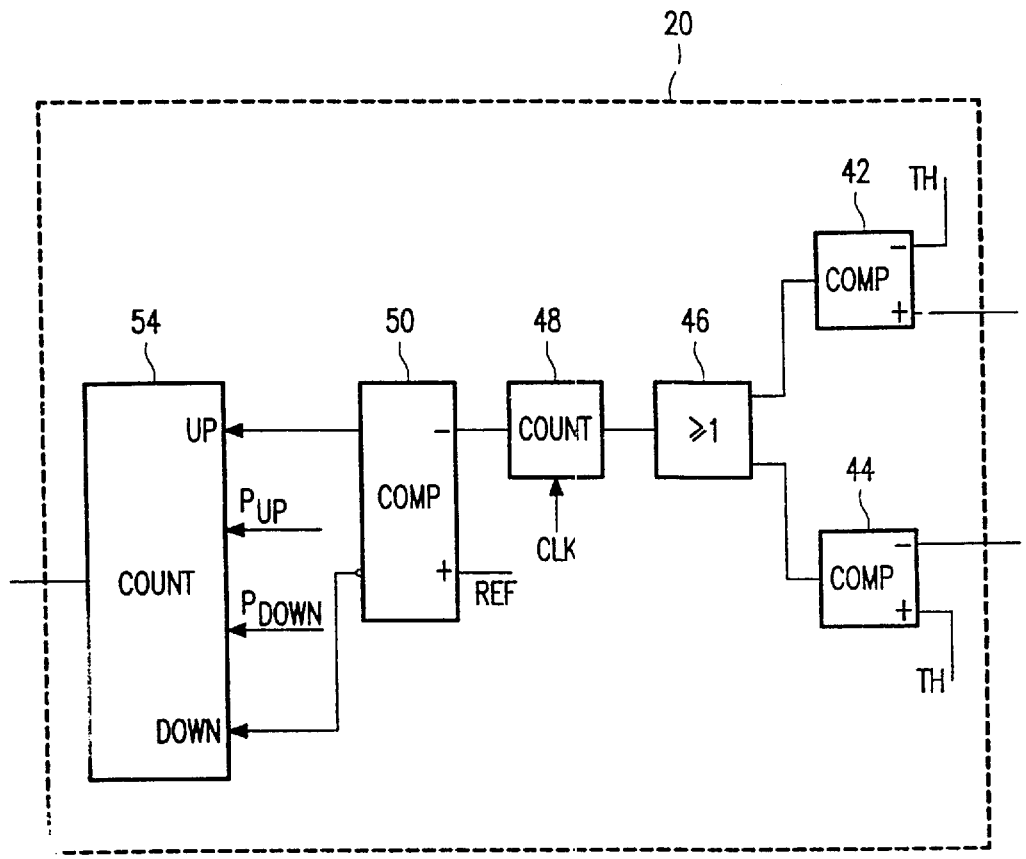
Figure 4:
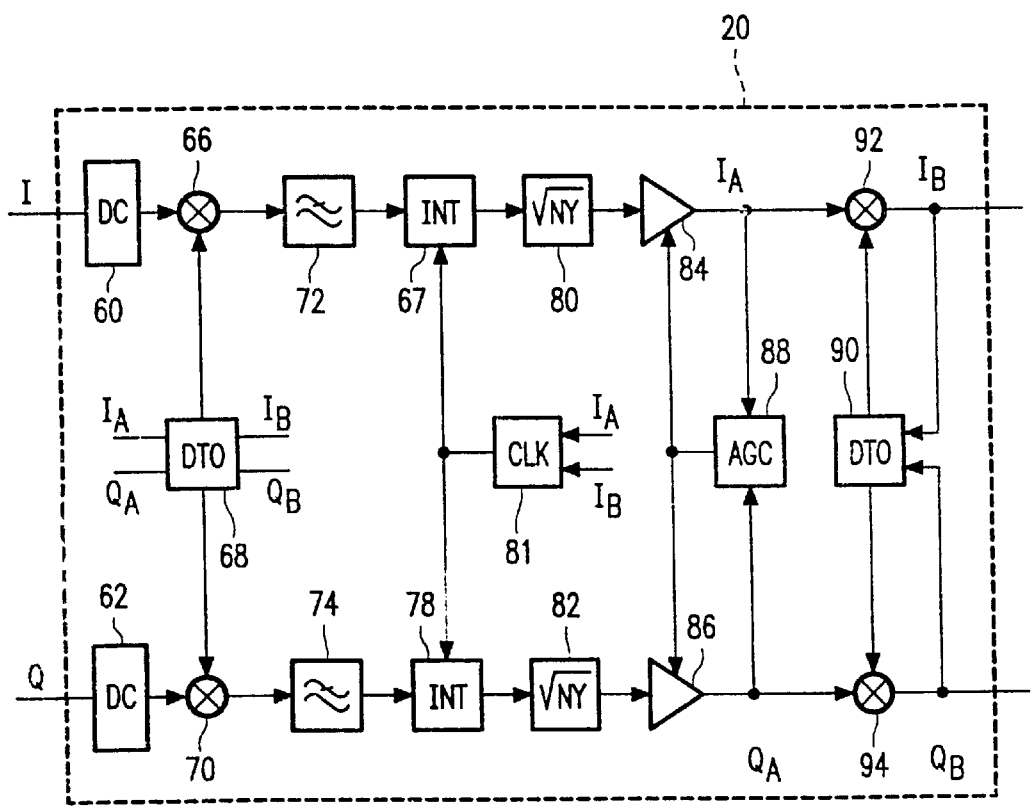

The invention will now be explained with reference to the drawing figures. Herein shows:

FIG. 1, a receiver according to the invention;

FIG. 2, an embodiment of the demodulator 10 for use in the receiver according to FIG. 1;

FIG. 3, an embodiment of the control means 20 for use in the receiver according to FIG. 1;

FIG. 4, an embodiment of the sample rate conversion means 26 for use in the receiver according to FIG. 1.

In the receiver according to FIG. 1, an input signal is applied to a first input of a tuner 2. A control signal, carrying a signal representing the selected channel, is applied to a second input of the tuner 2. An IF output of the tuner 2 is connected to an input of the first amplifier means, being here an amplifier 4. The output of the amplifier 4 is connected to an input of a SAW (Surface Acoustic Wave) filter 8. An output of the SAW filter 8 is connected to an input of a demodulator 10.

A first output of the demodulator 10, carrying an in-phase signal 1, is connected to an input of an amplifier 16, and to a first input of the first control means 12. A second output of the demodulator, carrying a quadrature signal Q, is connected to an input of an amplifier 18 and to a second input of the control means 12. An output of the control means 12 is connected to a control input of the controllable amplifier 4. The amplifier 8, the SAW filter 8, the demodulator 10 and the control means 12 are present in a first unit 6.

The second amplifier means comprise the combination of the amplifiers 16 and 18. An output of the amplifier 16 is connected to an input of an analog to digital converter 22 and the output of the amplifier 18 is connected to an input of an analog to digital converter 24. The analog to digital conversion means comprise the combination of the analog to digital converter 22 and the analog to digital converter 24. The output of the analog to digital converter 22 is connected to a first input of a sample rate converter 26. The output of the analog to digital converter 24 is connected to a second input of the sample rate converter 26. A first output of the sample rate converter 26 is connected to a first input of a decoder 28, and a second output of the sample rate converter 26 is connected to a second input of the decoder 28. At the output of the decoder 28 the decoded signal is available.

The tuner 2 converts the selected input signal into an IF signal with a nominal frequency of 480 MHz. In case of a receiver intended for DBS reception, the IF frequency can differ by 5 MHz from the nominal frequency due to drift of the local oscillator used in the LNC in the outdoor unit.

The output signal of the tuner 2 is amplified by the amplifier 8, and subsequently filtered by the SAW filter 8. The SAW filter 8 provides the adjacent channel selectivity. Its bandwidth is chosen 10 MHz wider than the maximum bandwidth of the signal to be received. The additional 10 MHz is chosen in order to prevent that desired signal falls outside the pass band of the SAW filter due to tolerances and drift of the LNC.

In the demodulator 10 the input signal is mixed with a quadrature oscillator signal having a fixed frequency of 480 MHz. At the output of the demodulator 8, demodulated signals I and Q are available. The control means 12 determine a signal P representing the power of the output signal of the demodulator. This signal P can be determined according to $P=I^2+Q^2$. In the case the output signal of the demodulator is not a quadrature signal, a signal P' which represents the power of the output signal of the demodulator can determining by determining the square, or an approximation thereof, of the output signal of the demodulator. In the control means, the signal P (or P') is subtracted from a reference value, and the difference signal is applied to a low pass filter. The output signal of the low pass filter is applied to the output signal of the control means. The output signal of the control means 12 causes, by adapting the gain of the controllable amplifier 4, the value of the power P of the signal represented by the signals I and Q to be equal to the reference value. This reference value is chosen to avoid distortion in the demodulator.

The quadrature signals I and Q are amplified by the amplifiers 16 and 18, and are subsequently sampled with a first sample rate and converted into digital signals by the analog to digital converters 10 and 12 respectively. In the case of a receiver for DVB a suitable choice for said first sample rate is 64 MHz. The control means determine whether the output of one of the analog to digital converters tends to overflow or whether the output signal of one of the analog to digital converters 16 or 18 is too low to exploit the full dynamic range of the analog to digital converters 16 and 18. This is done by counting the number of times the output signal of at least one of the analog to digital converters 22 or 24 assumes its maximum value. The gain of the amplifiers is adapted to obtain an output signal of the analog to digital converters 16 and 18, in which a predetermined fraction of the samples assumes a value larger or equal to the maximum value that can be represented by the output of the analog to digital converters.

The sample rate converter 26 converts the quadrature signals sampled by the first sample rate into quadrature signals sampled with a sample rate twice the actual symbol rate. The symbol rate can vary from 12 to 24 MHz. The sample rate converter 26 is also arranged for eliminating frequency and phase offsets of the signal at its input. The output signal of the sample rate converter 26 is decoded by the decoder 28.

It is observed that the present invention is explained with reference to a quadrature receiver, but the scope of the present invention is not limited thereto. It is e.g. possible that the demodulator provides a single signal. In such a case the amplifier means can comprise a single amplifier and the analog to digital conversion means can comprise a single analog to digital converter.

The input of the demodulator 10 according to FIG. 2 is connected to a first input of a multiplier 34 and to a first input of a multiplier 36. An output of an oscillator 30 is connected to a phase shift element 32. A first output of the phase shift element 32, carrying an in-phase oscillator signal, is connected to a second input of the multiplier 34, and a second output of the phase shift element 32, carrying a quadrature oscillator signal, is connected to a second input of the multiplier 36. An output of the multiplier 34 is connected to an input of a low pass filter 38. An output of the low pass filter 38 is connected to an output of the demodulator 10. An output of the multiplier 36 is connected to an input of a low pass filter 40. An output of the low pass filter 40 is connected to an output of the demodulator 10.

The local oscillator 30 is arranged as free running oscillator. It generates a signal with a frequency of 480 MHz. The oscillator is not included in a frequency control loop to avoid the necessity of an output signal of the second module to be applied to the first module. The phase shift element derives two signals having a mutual phase difference of 90°.

The input signal of the demodulator 10 is converted into base band signals by the mixers 34 and 36. The low pass filters 38 and 40 are arranged for eliminating all signals above the base band corresponding to the symbol rate of the digital symbols.

In the second control means 20 according to FIG. 3, a first input, carrying the output signal of the analog to digital converter 22, is connected to a first input of a comparator 42. A reference signal TH is applied to a second input of the comparator 42. A second input of the control means 20, carrying the output signal of the analog to digital converter 24, is connected to a first input of a comparator 44. The reference signal TH is also applied to a second input of the comparator 44.

An output of the comparator 42 is connected to a first input of an OR-gate 46, and an output of the comparator 44 is connected to a second input of the OR-gate 46. An output of the OR-gate 48 is connected to a first input of a counter 48. A clock signal CLK is applied to a second input of the counter 48. An output of the counter 48 is connected to a first input of a comparator 50. A reference signal REF is applied to a second input of the comparator 50.

A non-inverting output of the comparator 50 is connected to a first input of an up/down counter 54, and an inverting output of the comparator 50 is connected to a second input of the up/down counter 54. A signal $P_{UP}$, representing an up-count value, is applied to a third input of the up/down counter 54. A signal $P_{DOWN}$, representing a down-count value, is applied to a fourth input of the up-down counter 54. An output of the counter up/down counter 54 constitutes the output of the second control means 20.

The comparator 42 is arranged for determining whether the modulus of the output signal of the analog to digital converter 22 assumes its maximum value. This can easily be detected by comparing the signal representing the magnitude of the output signal of the analog to digital converter 22 with the reference value "111 . . . 111".

If said signal is equal to said reference value, the output signal of the comparator will have a value of "1", and the output signal of the OR-gate 50 will be equal to "1". The counter 48 is arranged to count, during a period covering 1024 sample instants, the number of times the output signal of the OR-gate 50 is equal to "1". This number of times represents the peak value of the output signal of the analog to digital converters 22 and 24.

The output signal of the counter 50, representing the peak value of the output signal of the analog to digital converters, is compared in the comparator 50 with the reference value REF. If the output signal of the counter 48 exceeds the reference value REF, the output of the comparator 50 will have a value of "0" and the inverting output of the comparator 50 will have a value of "1".

Consequently the up/down counter 54 will decrease its count by the value $P_{DOWN}$ at the end of the interval of 1024 sample periods. Because the output signal of the up/down counter 54 is used to control the gain of the amplifiers 16 and 18, said gain will be decreased to reduce the output signal of the analog to digital converter 22.

If the output signal of the counter 48 is smaller than the reference value REF, the output of the comparator 50 will have a value of "1" and the inverting output of the comparator 50 will have a value of "0".

Consequently the up/down counter 54 will increase its count by the value Pup at the end of the interval of 1024 sample periods. Because the output signal of the up/down counter 54 is used to control the gain of the amplifiers 16 and 18, said gain will be increased to enlarge the output signal of the analog to digital converter 22.

The comparator 44 performs the same function as the comparator 42, but now for the output signal of the analog to digital converter 24. The OR-gate 50 is present to combine the output signals of the comparators 42 and 44.

The value $P_{UP}$ and $P_{DOWN}$ can be different to obtain a fast reaction of the second control means if the output signal of at least one of the analog to digital converters 16 and 18 is too high, and to obtain a slower reaction of the second control means if the output signal of at least one of the analog to digital converters 16 and 18 is too low. The reason for these different reaction speeds is that a too high output signal has more adverse effects on the decoded signal than a too low output signal.

In the sample rate converter 26 according to FIG. 4, the in-phase signal I is applied to an input of an offset canceller 60. An output of the offset canceller 60 is connected to a first input of a mixer 66. The quadrature signal Q is applied to an input of an offset canceller 62. An output of the offset canceller 62 is connected to a first input of a mixer 70. A first output of a digital tunable oscillator (DTO) 68 is connected to a second input of the mixer 66 and a second output of a digital tunable oscillator 68 is connected to a second input of the mixer 70. An output of the mixer 66 is connected to an input of a low pass filter 72. An output of the mixer 70 is connected to an input of a low pass filter 74. An output of the low pass filter 72 is connected to an input of a decimator 76, and an output of the low pass filter 74 is connected to an input of a decimator 78. The output of the decimator 76 is connected to an input of a square root Nyquist filter 80 and the output of the decimator 78 is connected to an input of a square root Nyquist filter 82. The decimators 76 and 78 are controlled by a clock signal being generated by a clock signal recovery circuit 81. The frequency of said clock signal corresponds to twice the symbol rate $f_{SYMBOL}$.

The output of the filter 80 is connected to an input of an AGC amplifier 84, and the output of the filter 82 is connected to an input of an AGC amplifier 86. An output of the AGC amplifier 84, carrying output signal $I_A$, is connected to a first input of a mixer 92 and to a first input of a AGC controller 88. An output of the AGC amplifier 86, carrying output signal $Q_B$, is connected to a first input of a mixer 94 and to a second input of the third control means, being here an AGC controller 88. An output of the AGC controller 88 is connected to a control input of the AGC amplifiers 84 and 86.

A first output of a digital oscillator 90 is connected to a second input of the mixer 92, and a second output of the digital oscillator 90 is connected to a second input of the mixer 94. The output of the mixer 92 is connected to a first input of the digital oscillator 90, and an output of the mixer 94 is connected to a second input of the digital oscillator 90.

At the outputs of the mixers 92 and 94 are also the output signals $I_B$ and $Q_B$ available.

The offset cancellers 60 and 62 are present to provide I and Q signals without any DC offset to the next elements of the receiver. The purpose of the combination of the mixers 66 and 70 and the digital tunable oscillator 68 is to provide a signal for the first (in-phase and quadrature) filters 22 and 24 being free from frequency offsets. This is done by measuring the frequency of the signals $I_A$ and $Q_A$, and adjusting the oscillator 18 if the frequency of said signals differs from 0. The output signals of the mixers 66 and 70 are filtered by the filters 72 and 74 in order to prevent aliasing due to the decrease of the sample rate in the decimators 26 and 28.

The decimators 76 and 78 convert their input signals with the first sample rate (e.g. 64 MHz) into an output signal with a second sample rate being equal to twice the actual symbol rate of the signal received. This second sampling rate can e.g. vary from 24 to 48 MHz. The decimators 76 and 78 are known to those skilled in the art and are e.g. described in the article Interpolation in Digital Modems—Part I: Fundamentals, by F. M. Gardner in IEEE transactions on communications, Vol. 41, No. 3, Mar. 1993, pp. 501–507 and in the article Interpolation in Digital Modems—Part II: Implementation and performance, by L. Erup, F. M. Gardner and R. A. Harris in IEEE transactions on communications, Vol. 41, No. 6, Jun. 1993, pp. 998–1008. An alternative embodiment of the decimators 26 and 28 is described in U.S. Pat. No. 5,349,548.

The output signals of the decimators 76 and 78 are filtered by means of the filters 80 and 82 which have a square root Nyquist transfer function. For this transfer function can be written:

$$|H(f)|^2 = \begin{cases} 1; f \le \dfrac{f_{SYMBOL}(1-\alpha)}{2} \\ \dfrac{1}{2}\left\{1 + \cos\left(\pi \dfrac{2f - f_{SYMBOL}(1-\alpha)}{2\alpha f_{SYMBOL}}\right)\right\}; \dfrac{f_{SYMBOL}(1-\alpha)}{2} < f \le \dfrac{f_{SYMBOL}(1+\alpha)}{2} \\ 0; f > f \le \dfrac{f_{SYMBOL}(1+\alpha)}{2} \end{cases} \quad (1)$$

In (1) $|H(f)|^2$ is the square of the modulus of the transfer function of the filters 30 and 32, $f_{SYMBOL}$ is the actual symbol frequency, and $\alpha$ is the so-called roll-off factor.

The amplifiers 84 and 86 together with the AGC controller 88 provide an output signal having a constant amplitude. The mixers 92 and 94 are arranged for eliminating phase errors from the output signals of the amplifiers 84 and 86. Therefor the output signals of the amplifiers are mixed with a signal from the controlled oscillator 90 which uses the output signals $I_B$ and $Q_B$ of the mixers 92 and 94 for comparison with a reference value in order to determine the phase error. The advantage of the use of a separate frequency control loop, comprising the oscillator 68 and the mixers 66 and 70, and a separate phase control loop, comprising the oscillator 90 and the mixers 92 and 94, is a substantially reduced acquisition time. Furthermore the low delay in the phase control loop results in an excellent suppression of phase noise. For low symbol rates, the use of separate loops can lead to cycle slips in the first loop which cannot be corrected by the second loop. To prevent these cycle slips, in the case of low symbol rates the controllable oscillator 68 makes also use of a signal representing the phase error. This is indicating by applying, besides the signals $I_A$ and $Q_A$, also the signals $I_B$ and $Q_B$ to the oscillator 68. The signals $I_B$ and $Q_B$ constitute the output signals of the sampling rate converter 26.

What is claimed is:

1. A receiver comprising an input being coupled to an input of a first controllable amplifier means, an output of the first controllable amplifier means being coupled to an input of a demodulator, an output of the demodulator being coupled to an input of a second controllable amplifier means, an output of the second controllable amplifier means being connected to an input of analog to digital converter, wherein the receiver includes a first control means for controlling the gain of the first controllable amplifier means in response to a signal representative for a signal at the output of the demodulator, and in that the receiver comprises a second control means for controlling the gain of the path from the output of the demodulator to the input of the analog to digital converter means in response to a signal representative for a signal at the output of the analog to digital converter means.

2. The receiver according to claim 1, wherein the first control means is arranged to control the first controllable amplifier means for obtaining a signal representing the signal at the output of the demodulator having a substantially constant power, and in that the second control means is arranged to control the second amplifier means for obtaining a signal representative for the signal at the output of the analog to digital converter means a signal having a substantially constant amplitude.

3. Receiver according to claim 1, wherein the demodulator comprises an in-phase output carrying an in-phase demodulated signal, and a quadrature output carrying a quadrature demodulated signal, in that the second controllable amplifier means comprising a first controllable amplifier having an input coupled to the in-phase output of the demodulator, and a second controllable amplifier having an input coupled to the quadrature output of the demodulator, in that the analog to digital converter means comprises a first analog to digital converter having its input coupled to an output of the first controllable amplifier and in that the analog to digital converter means comprises a second analog to digital converter having its input coupled to an output of the second controllable amplifier.

4. Receiver according to claim 1, wherein the receiver comprises conversion means for converting the output signal of the analog to digital conversion means into an output signal having a sampling rate corresponding to a symbol rate of digital symbols carried by the output signal of the analog to digital conversion means, and in that the receiver comprises third control means for obtaining an output signal having a substantially constant amplitude.

5. Receiver according to claim 1, wherein the receiver comprises a first module including the first controllable amplifier means, the first control means and the demodulator, and a second module comprising the second controllable amplifier means and the analog to digital converter means, and in that the second module does not comprise any outputs coupled to inputs of the first module.

* * * * *

UNITED STATES PATENT AND TRADEMARK OFFICE
CERTIFICATE OF CORRECTION

PATENT NO. : 6,163,685
DATED : December 19, 2000
INVENTOR(S) : Jun Suzuki

It is certified that error appears in the above-identified patent and that said Letters Patent is hereby corrected as shown below:

Column 1,
Line 13, "technology" should read -- technology. --.
Line 46, "are" should be deleted.

Column 3,
Line 57, "rotated" should read -- rotate --.

Column 4,
Line 52, "their" should read -- the --.

Column 7,
Lines 3 and 19, "key board" should read -- keyboard --.
Line 21, "connection-with" should read -- connection with --.
Line 51, "FIG. 17," should read -- FIG. 7, --.
Line 64, "mean" should read -- medium --.

Column 8,
Line 3, "key-board" should read -- keyboard --.
Line 12, "end" should read -- and --.
Line 21, "key board" should read -- keyboard --.

Column 11,
Line 3, "a" ($2^{nd}$ occurrence) should be deleted.

Column 12,
Line 28, "make" should read -- makes --.

UNITED STATES PATENT AND TRADEMARK OFFICE
CERTIFICATE OF CORRECTION

PATENT NO. : 6,163,658
DATED : December 19, 2000
INVENTOR(S) : Jun Suzuki

It is certified that error appears in the above-identified patent and that said Letters Patent is hereby corrected as shown below:

<u>Column 13,</u>
Line 30, "for" should read -- or --.

Signed and Sealed this

Twenty-seventh Day of November, 2001

*Attest:*

NICHOLAS P. GODICI
*Acting Director of the United States Patent and Trademark Office*

*Attesting Officer*